United States Patent
Daiber

(10) Patent No.: US 10,340,660 B2
(45) Date of Patent: Jul. 2, 2019

(54) SEMICONDUCTOR TUNABLE LASER PACKAGE WITH TUNABLE OPTICAL FILTERS SUBASSEMBLY

(71) Applicant: Neophotonics Corporation, San Jose, CA (US)

(72) Inventor: Andrew John Daiber, Emerald Hills, CA (US)

(73) Assignee: NeoPhotonics Corporation, San Jose, CA (US)

(*) Notice: Subject to any disclaimer, the term of this patent is extended or adjusted under 35 U.S.C. 154(b) by 110 days.

(21) Appl. No.: 15/132,032

(22) Filed: Apr. 18, 2016

(65) Prior Publication Data

US 2016/0233646 A1 Aug. 11, 2016

Related U.S. Application Data

(63) Continuation of application No. 14/100,530, filed on Dec. 9, 2013, now abandoned.

(51) Int. Cl.
| | |
|---|---|
| *H01S 5/14* | (2006.01) |
| *H01S 5/022* | (2006.01) |
| *H01S 5/0683* | (2006.01) |
| *H01S 5/024* | (2006.01) |

(52) U.S. Cl.
CPC .......... *H01S 5/141* (2013.01); *H01S 5/02208* (2013.01); *H01S 5/02216* (2013.01); *H01S 5/02248* (2013.01); *H01S 5/02284* (2013.01); *H01S 5/0683* (2013.01); *H01S 5/02415* (2013.01)

(58) Field of Classification Search
CPC ...... H01S 5/141; H01S 5/142; H01S 5/02216; H01S 5/02208; H01S 5/02284; H01S 5/02248; H01S 5/0683; H01S 5/02415
See application file for complete search history.

(56) References Cited

U.S. PATENT DOCUMENTS

| | | |
|---|---|---|
| 5,140,599 A | 8/1992 | Trutna et al. |
| D396,817 S | 8/1998 | Webb |
| D457,446 S | 5/2002 | Kallabis |
| D461,135 S | 8/2002 | Watson et al. |
| 6,577,388 B2 | 6/2003 | Kallabis |
| 6,763,596 B1 | 7/2004 | Puri et al. |
| 7,257,142 B2 | 8/2007 | Sochava et al. |
| 7,621,747 B1 | 11/2009 | Burrow |
| 7,720,122 B2 | 5/2010 | Matsushita et al. |
| 7,886,450 B1 | 2/2011 | Fiano |
| D646,992 S | 10/2011 | Tuli |
| 8,061,046 B2 | 11/2011 | Stefan et al. |
| D668,976 S | 10/2012 | Stilz |

(Continued)

OTHER PUBLICATIONS

U.S. Appl. No. 61/444,362, filed Feb. 18, 2011, Daiber et al.

(Continued)

*Primary Examiner* — M. A. Golub-Miller
(74) *Attorney, Agent, or Firm* — Mueting, Raasch & Gebhardt, P.A.

(57) ABSTRACT

A tunable laser configured in a small package subassembly including a gain chip positioned in the interior space between first and second tunable filter subassemblies. The tunable laser is packaged in either a rectangular or cylindrical housing, with an electrical input interface positioned at one end of the housing.

15 Claims, 6 Drawing Sheets

(56) References Cited

U.S. PATENT DOCUMENTS

| | | |
|---|---|---|
| 8,462,823 B2 | 6/2013 | Daiber et al. |
| 8,467,036 B2 | 6/2013 | Gogolla et al. |
| D692,327 S | 10/2013 | Asher et al. |
| 8,902,945 B1 | 12/2014 | He et al. |
| 8,923,348 B2 | 12/2014 | Liu et al. |
| 2001/0025922 A1 | 10/2001 | Lautenschlager et al. |
| 2003/0001164 A1* | 1/2003 | Fujihara .............. G02B 6/4208 257/81 |
| 2005/0141574 A1 | 6/2005 | Sakano et al. |
| 2005/0286581 A1 | 12/2005 | Shinohara et al. |
| 2011/0032955 A1 | 2/2011 | Daiber |
| 2011/0033192 A1 | 2/2011 | Daiber et al. |
| 2011/0182305 A1 | 7/2011 | Daiber et al. |
| 2012/0002689 A1* | 1/2012 | Wojcik ..................... G02F 1/39 372/28 |
| 2015/0162723 A1 | 6/2015 | Daiber |

OTHER PUBLICATIONS

Bukkems et al., "Optical Internetworking Forum: Micro Integrable Tunable Laser Assembly Implementation Agreement," The Optical Networking Forum, Fremont, CA, Sep. 20, 2011; 19 pgs.

* cited by examiner

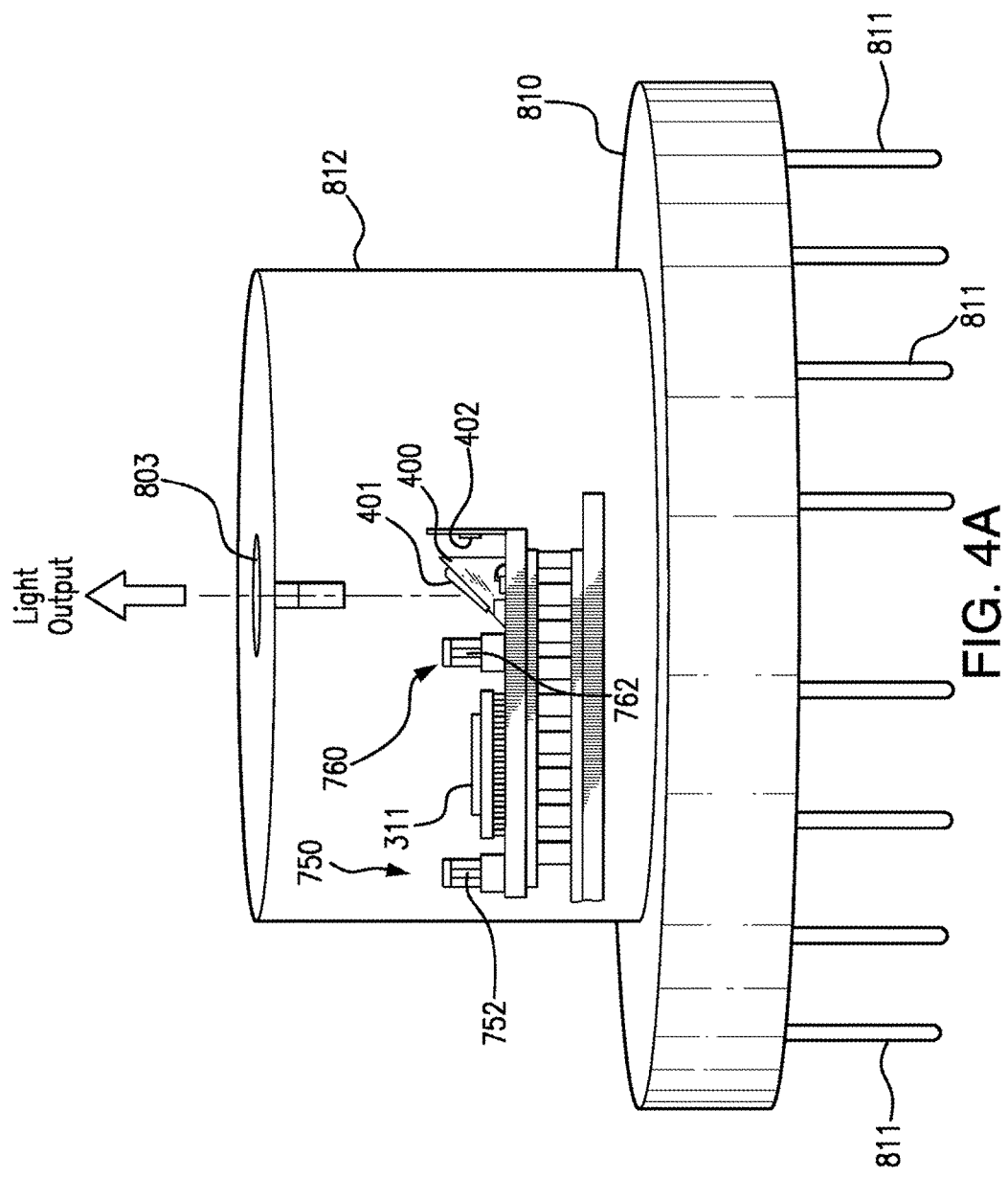

SEMICONDUCTOR TUNABLE LASER PACKAGE WITH TUNABLE OPTICAL FILTERS SUBASSEMBLY

REFERENCE TO RELATED APPLICATIONS

This application is a continuation of U.S. patent application Ser. No. 14/100,530, filed Dec. 9, 2013, which is incorporated by reference in its entirety. Further, U.S. patent application Ser. No. 13/774,309, filed Feb. 22, 2013, which is a continuation-in-part of U.S. patent application Ser. No. 13/080,519, filed Apr. 5, 2011, now U.S. Pat. No. 8,462,823, which in turn claims priority to provisional application No. 61/444,362, filed Feb. 18, 2011, and which in turn is a continuation-in-part of U.S. patent application Ser. No. 12/722,825, filed Mar. 12, 2010, and which in turn is a continuation-in-part of U.S. patent application Ser. No. 12/537,026, filed Aug. 6, 2009, are each incorporated by reference herein in their entireties.

FIELD OF THE INVENTION

The present application is directed to a tunable laser and, more particularly, to a small, packaged tunable laser assembly.

BACKGROUND

Tunable lasers may be packaged as a component of an optical transceiver, or may be used in other applications outside of an optical transceiver. Tunable lasers are generally packaged with other components including an electrical interface and an optical interface.

There is an ever-constant challenge in the industry to reduce the size of tunable laser packages, modulation components, and tunable laser transmitters. The reduction in size may allow lasers and transmitters to be used in a greater number of applications. The reduction in size provides numerous design challenges for the package components to fit within the limited space and also not compromise performance or reliability.

In applications in which tunable lasers and transmitters are a component of an optical transceiver, the tunable lasers and transmitters should be sized for use with one of the various form factors. The various form factors provide standardized dimensions and electrical input/output interfaces that allow devices from different manufacturers to be used interchangeably. Examples of form factors include but are not limited to XENPAK, SFF ("Small Form Factor"), SFP ("Small Form Factor Pluggable"), XFP ("10 Gigabit Small Form Factor Pluggable"), CFP ("One Hundred Gigabit Form Factory Pluggable"), ITLA ("Integrable Tunable Laser Assembly"), and the micro-ITLA ("micro-Integrable Tunable Laser Assembly").

Therefore, while other applications have been directed to one configuration of the tunable laser component, there is also a need for a small, packaged tunable laser assembly for various applications in different configurations and packages.

SUMMARY

The present application is directed to tunable laser assemblies configured in a small package. The tunable lasers may include a housing, an electrical input interface, an optical output, a tunable semiconductor laser and a focusing lens assembly for coupling the output to an optical fiber. In some embodiments, the housing has a volume of less than 0.6 cubic centimeters. In some embodiments, the housing is rectangular with six planar exterior walls including a bottom, a top, opposing first and second ends, and opposing sidewalls. The exterior walls form a hermetically sealed interior space that includes a major axis that extends through the first and second ends. The electrical input interface is positioned at the first end of the housing and aligned with the major axis. The optical output interface is positioned at the second end of the housing and aligned with the major axis. The tunable semiconductor laser is positioned in the interior space and operable to emit a laser beam having a selectable wavelength that may be adjusted by an electrical input signal to the laser. In some embodiments, the focusing lens assembly is positioned in the interior space along an optical path of the laser beam to operatively couple the modulated optical output beam to the optical output interface, and in other embodiments the focusing lens assembly is positioned exterior to the housing.

In another aspect, the present disclosure provides a small, packaged tunable optical laser assembly comprising a housing having a volume of less than 0.6 cubic centimeters, the exterior walls forming a hermetically sealed interior space that includes a major axis that extends through the first and second ends; an electrical input interface positioned at the first end of the housing and aligned with the major axis, the electrical input interface configured to receive an information-containing electrical signal; an optical output interface positioned at the second end of the housing and aligned with the major axis, the optical output interface configured to transmit an optical communication beam; a tunable semiconductor laser positioned in the interior space and operable to emit a laser beam having a selectable wavelength.

In some embodiments, the tunable semiconductor laser is an external cavity laser that includes a tunable filter.

In some embodiments, the tunable filter comprises a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of the first optical filter to align a single transmission peak of each of the first and second sets of transmission peaks.

In some embodiments, there further comprises a base in the interior of the housing; first and second optical filter subassemblies operatively coupled to the base, the first optical filter subassembly having a rear facet and a substantially non-reflective front facet, the base further including: a gain chip to emit a plurality of photons in response to a first electrical input, disposed between the first and second optical filter subassemblies.

In some embodiments, the optical path is aligned along the major axis of the housing.

In some embodiments, the coupling optics includes a focusing lens.

In some embodiments, a thermoelectric cooler is positioned within the interior space between the bottom of the housing and at least one of the tunable semiconductor laser.

In some embodiments, the electrical input interface includes a row of pins extending from the housing to enable an electrical connector to be coupled thereto.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

FIG. 4A is a side elevational view of a small, packaged tunable laser according to a fourth embodiment.

DETAILED DESCRIPTION

Figure 1A:
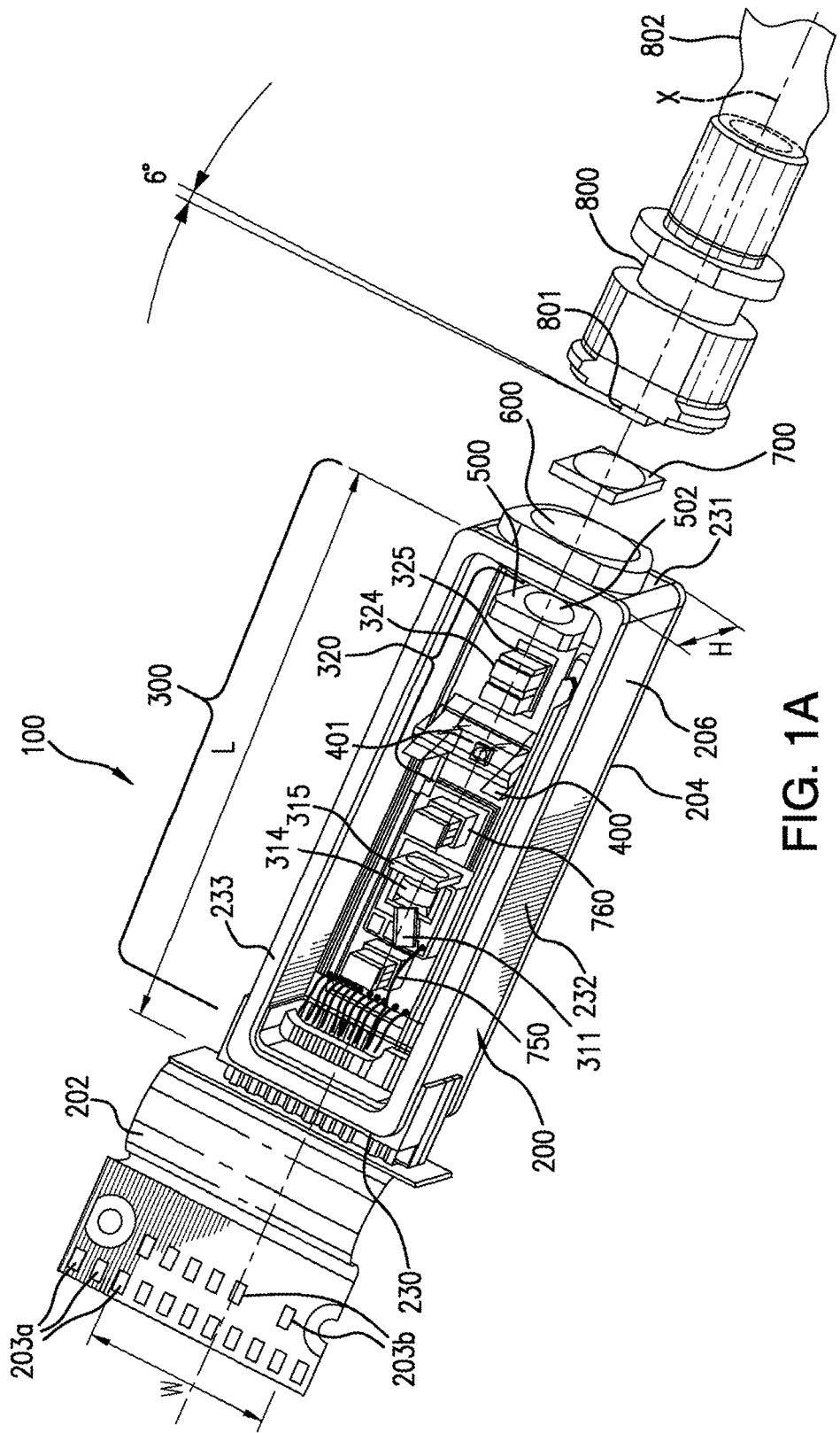
FIG. 1A is a top perspective view of the small, packaged tunable laser subassembly according to one embodiment.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1B:
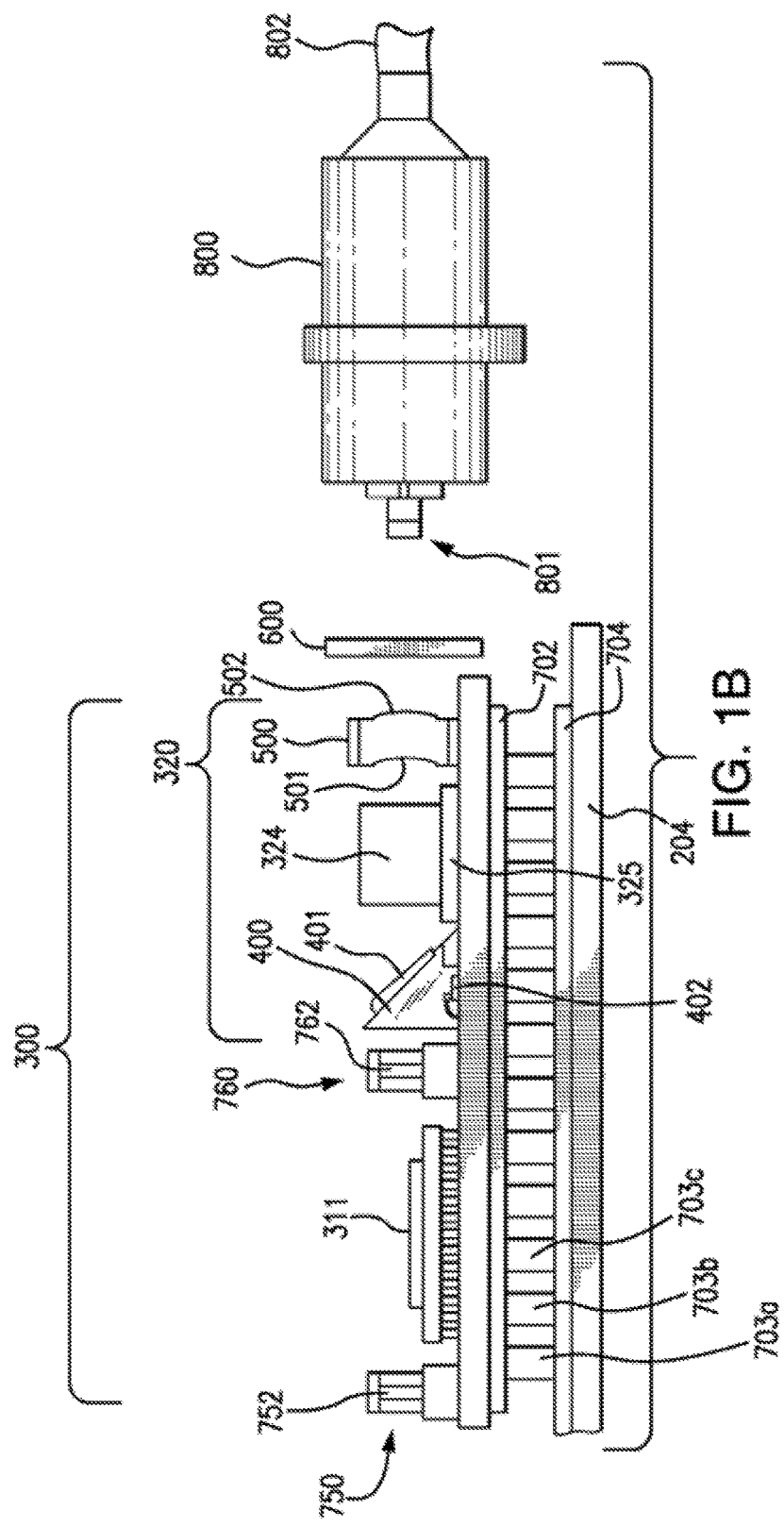
FIG. 1B is a side elevational view of a small, packaged tunable laser according to the embodiment of FIG. 1A without depicting external cavity lenses and a fiber focus alignment lens.
Figure 2:
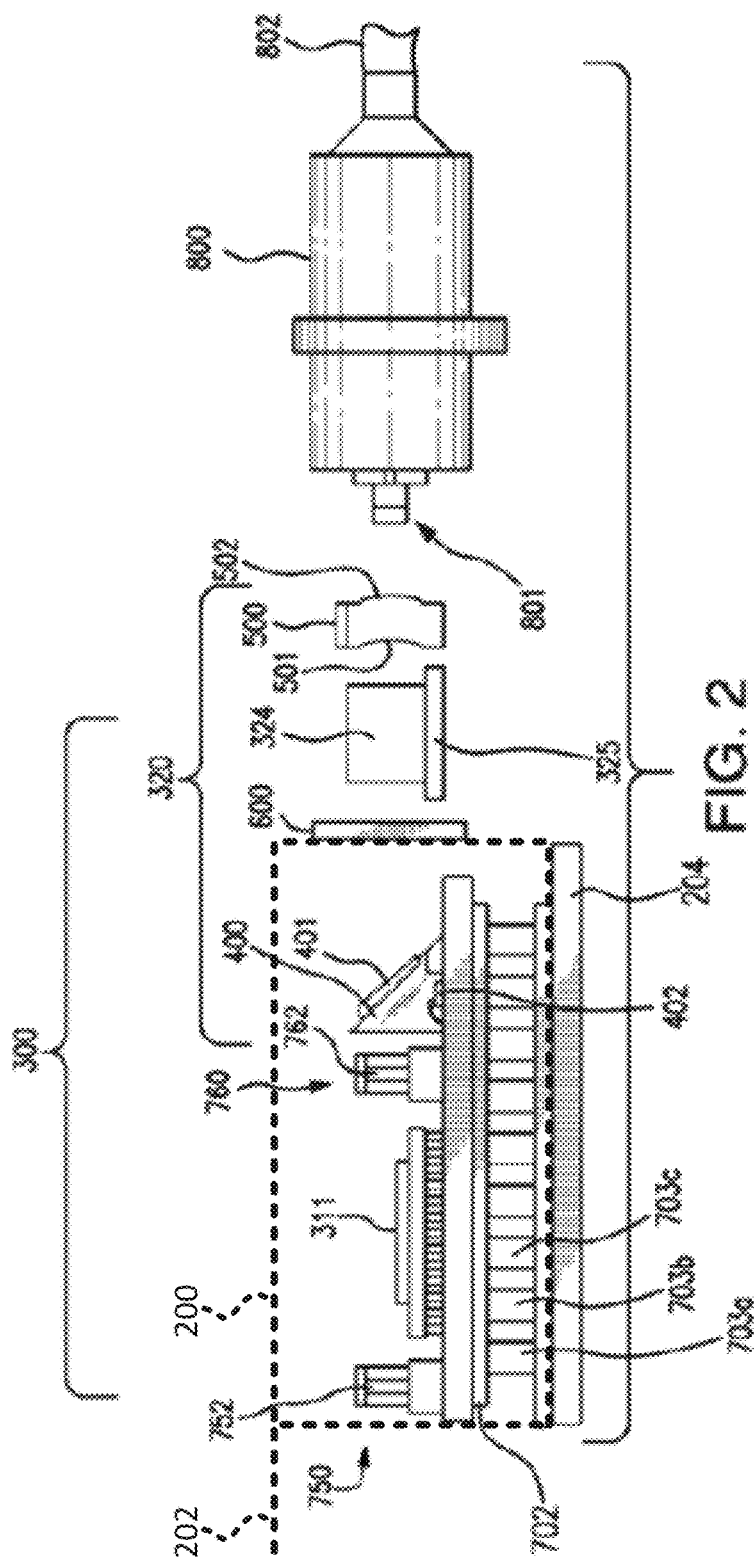
FIG. 2 is a side elevational view of a small, packaged tunable laser according to a second embodiment.
Figure 3:
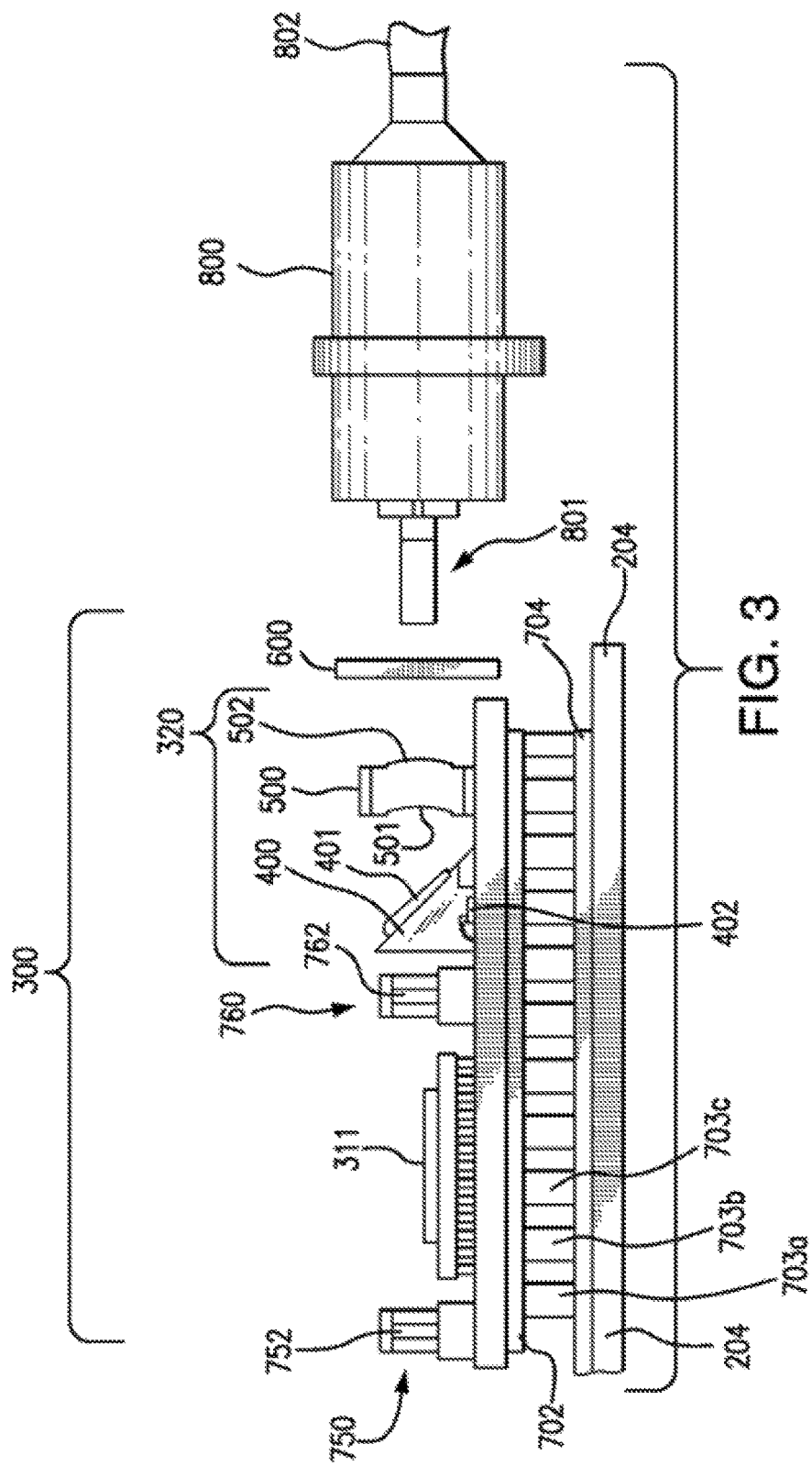
FIG. 3 is a side elevational view of a small, packaged tunable laser according to a third embodiment.
Figure 4B:
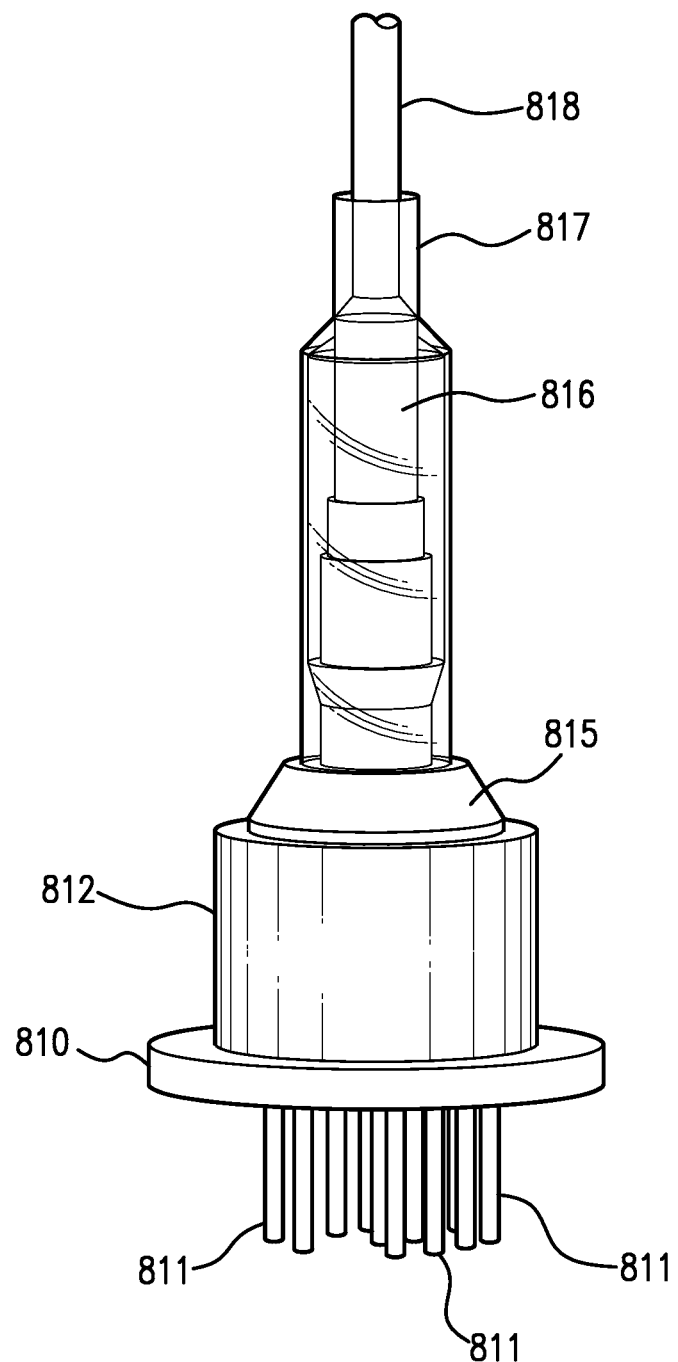
FIG. 4B is a side perspective view of the small, packaged tunable laser of FIG. 4A with an attached optical fiber.

The present application is directed to a small, packaged tunable laser 100 as illustrated in one embodiment in FIG. 1A, first, second and third embodiments in FIGS. 1B, 2, and 3 respectively, and another embodiment of a package or subassembly including the tunable laser as illustrated in FIGS. 4A and 4B.

The tunable laser 100 is packaged in one embodiment in a rectangular housing 200 that forms an interior space for housing the laser components 300. The laser 100 is packaged in housing which is particularly small and compact in size which makes it especially suitable for use in pluggable optical transceivers and various other module configurations or applications. In the present disclosure, the laser 100 may be coupled to a printed circuit board which includes circuitry for data packet formatting and control of the power and frequency of the laser, and an electrical and mechanical interface for mounting the packaged subassembly on a customer's transmitter platform or card rack assembly.

The housing 200 includes, in one embodiment, a generally rectangular body 206 with exterior walls that forms a substantially rectangular shape. The body 206 includes a bottom 204, a cover (not illustrated), first and second ends 230, 231, and opposing sidewalls 232, 233. The cover may be substantially planar and positioned on the top surfaces of the first and second ends 230, 231 and opposing sidewalls 232, 233. In one embodiment, the cover is substantially identical to the bottom 204.

The housing 200 includes a substantially rectangular shape with a width W formed by the opposing sidewalls 232, 233, a length L formed by the first and second ends 230, 231, and a height H that extends between the bottom 204 and top of the sidewalls 232, 233 and ends 230, 231. The housing 200 may include various sizes. In one specific embodiment, the width W is about 5.4 mm, the length L is about 17.1 mm, and the height H is about 5.9 mm. The volume of the interior space formed by the housing 200 may also vary depending upon the application. Exemplary volumes may range from between about 400 mm$^3$ to about 600 mm$^3$. In one specific embodiment, the volume is about 545 mm$^3$. The housing 200 includes an elongated shape with a major axis X extending along the length L through the first and second ends 230, 231, and a minor axis Y perpendicular to the major axis and extending through the opposing sidewalls 232, 233. The housing 200 may be hermetically sealed to protect the laser components 300 from humidity and other environmental conditions.

On the first end 230 of the housing 200 is an electrical interface 202 which in one embodiment is configured as two parallel rows of metal pads 203a and 203b respectively. Other embodiments may utilize a connector with electrical pins. The electrical interface 202 is configured to receive power and control information-containing electrical signals (which may have an RF frequency from 10 to 25 GHz, or in four channels each in the range of 10 to 25 GHz), or control signals such as a signal to adjust the wavelength of the laser, or other characteristics of the output laser beam.

An optical output interface 800 extends outward from the second end 231 of the housing 200. In one embodiment, the optical output interface 800 is an optical fiber ferrule or "pigtail" aligned with the major axis X of the housing 200. The optical output interface 800 is configured to transmit a continuous wave optical beam that is emitted from the laser components 300 over an optical fiber contained within the interface. The optical output power may be 40 mW or less.

The laser components 300 generally include an external cavity laser and coupling optics 320. The external cavity laser includes a diode gain chip 311 comprising a Fabry-Perot diode laser with a substantially non-reflective front facet and a rear facet. The gain chip may also include a curved-waveguide structure as more particularly described in U.S. patent application Ser. No. 13/567,307, filed Aug. 6, 2012.

The external cavity laser further includes a tunable filter comprising first and second optical filter subassemblies 750, 760 that form a tunable filter (including tunable filter elements 752 and 762).

Possible implementations of the tunable filter include but are not limited to Bragg gratings, Fabry-Perot etalons, and liquid crystal waveguides. In one embodiment, the tunable filter includes a pair of spaced apart tunable elements or etalons 752, 762. The etalons 752, 762 are Fabry-Perot spaced etalons that are positioned in a parallel configuration. The first etalon 752 includes a thickness measured between opposing faces and a refractive index according to the material from which it is constructed. The second etalon 762 includes a thickness measured between its opposing faces and a refractive index according to the material from which it is constructed. The etalons 752, 762 may be constructed from the same or different materials, and may include the same or different thicknesses. Etalons 752, 762 may be constructed from various materials, such as but not limited to silicon and gallium arsenide. One or both etalons 752, 762 are tunable by a temperature-induced change in their refractive indexes and/or a temperature-induced change in their thickness. In one embodiment, the etalons 752, 762 are tunable by simultaneous control of both the refractive index and the physical thickness.

In one embodiment, the tunable filter utilizes a Vernier tuning mechanism including respective first and second optical filters 752, 762 having respective sets of transmission peaks having slightly different free spectral ranges and similar finesses. Tuning is performed by shifting the set of transmission peaks of the second optical filter 762 relative to the set of transmission peaks of first optical filter 752 to align a single transmission peak of each of the first and second sets of transmission peaks.

The external cavity tunable laser may be configured with the tunable filter 752/762 being decoupled from the gain chip 311. This configuration results in the tunable filter 752/762 being very stable and therefore does not require an external wavelength locker as required in Distributed Feedback (DFB) lasers and Distributed Bragg Reflector (DBR) lasers. Other advantages of the external cavity tunable laser over these other lasers are the extremely narrow linewidth and very high side mode suppression ratio.

The coupling optics 320 provide isolation and coupling to the optical output interface 800. The coupling optics 320 efficiently couple light from the gain chip 311 to the optical output interface 800. A total optical magnification of the coupling optics 320 and the external cavity lenses 314, 315 is chosen to correct for the difference between mode field diameters of the gain chip 311 and the optical fiber 802.

The coupling optics 320 directly downstream of the filter subassembly 760 includes a wedge shaped support 400 which supports a planar beam splitter 401. The beam splitter 401 is arranged on the support 400 so that its plane is at a 45 degree angle with respect to the incoming beam. In some embodiments, photodiode 402 is mounted on the surface of the base below the beam splitter 401. The beam splitter 401 directs a small portion (e.g. 5%) of the output beam to the photodiode 402, which functions to sense the intensity level of the tunable laser output, so that the user may appropriately control the current to the laser to achieve the desired optical output level or intensity. The remainder of the output beam is directed by a beam splitter to the optical isolator 324.

The positioning of the optical isolator 324 downstream of the beam splitter 401 is one of the features of the embodiment of the present disclosure that distinguishes it from U.S. patent application Ser. No. 13/080,519, filed Apr. 5, 2011. Experimental data has shown that the positioning of the optical isolator 324 upstream of the beam splitter 401 resulted in a noisy feedback signal, which for many applications and operational conditions was undesirable.

The coupling optics 320 includes an optical isolator 324 disposed directly downstream of the beam splitter 401. The optical isolator 324 may include a two-stage isolator that prevents light reflected from coupling optics 320 from getting back into the external cavity tunable laser. The isolator 324 may also rotate a light polarization by 90 degrees to improve transmission. In one embodiment, the optical path is aligned substantially along the major axis X of the housing 200.

In some embodiments, the isolator 324 is mounted on a piezoelectric transducer (PZT) 325. The PZT 325 functions to provide dithering during frequency tuning, which enables locking onto the target frequency more rapidly. The PZT in turn is mounted on the sled or circuit board which has traces thereon that provide the electrical connection to the PZT 325.

The coupling optics 320 directly downstream of the optical isolator 324 is a single one-piece integral collimating lens 500 including a concave first surface 501 and a convex second surface 502. Downstream from the collimating lens 500 is a window 600 which is attached to the housing 200 and permits the collimated beam to exit the housing 200. Outside of the housing 200 and coupled to the collimated beam is the optical output interface, which includes a fiber focus alignment lens 700 and the optical fiber ferrule 800. In the embodiment depicted, the cladded optical fiber 802 is a "pig-tail" that extends for a relatively short distance to allow coupling to other subassemblies. In another embodiment (not depicted), the window 600 or the alignment lens 700 may be the final downstream components associated with the housing 200, to allow the user to couple an optical fiber directly to the outside of the housing 200 through a pluggable connector or other optical interface.

In some embodiments, the end portion of the ferrule 800 includes a polarizer 801 which has a planar entry end face which is inclined at an angle of about six (6) degrees from a plane which is normal to the incoming central beam from the lens 700. The inclination of the plane is provided to prevent reflections of the incoming beam from the surface of the planar entry end face from going back into the lens 700 and back through the coupling optics 800 into the laser cavity.

As shown in FIG. 1 B, a thermoelectric cooler includes first and second plates 702 and 704, respectively, separated by intermediate members 703a, 703b, 703c, etc., that provides a base for supporting the various elements of the tunable laser 100. In one embodiment, the thermoelectric cooler (comprised of elements 702, 703, 704) is positioned between the bottom 204 of the housing 200 and one or more of the laser components 300. The plates 702, 704 may be constructed from a variety of materials, including ceramics. The intermediate members 703a, 703b, etc., each include a first end operatively connected to the first plate 702 and a second end operatively connected to the second plate 704. The intermediate members 703a, 703b, etc. are electrically connected in series by connectors. The intermediate members 703a, 703b, etc., are constructed from semiconductor material that allows for electron flow through the member 703a, 703b, etc. when connected to a DC power source. In use, as the DC power source is activated and a current passes through the series of intermediate members 703a, 703b, etc., the current causes a decrease in temperature at the first plate 702 that absorbs heat from the laser components 300. The heat is transferred through the plate 702 and intermediate members 703a, 703b, etc., into the second plate 704. This heat may then be transferred from the second plate 704, such as to a heat sink.

Likewise, the temperature of the tunable filter may be separately controlled from the other laser components 300. A bench, which may be composed of a glass, may provide thermal isolation from the thermoelectric cooler.

One example of a tunable laser is disclosed in U.S. Pat. No. 7,257,142, herein incorporated by reference. Such patent describes what may be called an "integrated design" in contrast with an arrangement of discrete components such as described in the present disclosure.

FIG. 2 is a side elevational view of a small, packaged tunable laser according to a second embodiment of the present disclosure. In this embodiment, the components of the tunable laser are essentially identical to that depicted and described in FIGS. 1A and 1B except that the optical isolator 324 and the collimating lens 500 are now located downstream from the window 600 and therefore exterior to the housing 200.

FIG. 3 is a side elevational view of a small, packaged tunable laser according to a third embodiment of the present disclosure. In this embodiment, the components of the tunable laser are essentially identical to that depicted and described in FIG. 1 except that the optical isolator 324 is eliminated.

FIG. 4A is a side elevational view of a small, packaged tunable laser according to a fourth embodiment of the present disclosure. In this embodiment, the components of the tunable laser are essentially identical to that depicted and described in FIG. 1 except that the base 704 and the laser components 300 are now mounted inside a cylindrical housing 812 instead of a rectangular housing, and the outgoing optical path is accordingly modified. More particularly, the coupling optics directly downstream of the filter subassembly 760 includes a wedge shaped support 400 which supports a planar beam splitter 401. The beam splitter 401 is arranged on the support 400 so that its plane is at a 45 degree angle with respect to the incoming beam. In some embodiments, photodiode 402 is mounted on a surface directly in the path of the optical beam passing through the beam splitter 401. The beam splitter 401 directs a small portion (e.g. 5%) of the output beam to the photodiode 402, which functions to sense the intensity level of the tunable laser output, so that the user may appropriately control the current to the laser to achieve the desired optical output level or intensity. The remainder of the output beam is directed by the beam splitter along an optical path above the laser components 300 to the polarizer. In this embodiment, the optical isolator 324 and the collimating lens 500 have been eliminated, making for a small, compact laser configuration.

A window 803 is provided on the top surface of the cylindrical housing 812 to allow the beam to exit the housing. Below the cylindrical housing 812 is a base 810 which supports an array of pins 811 which constitute the electrical interface of the laser.

FIG. 4B is a side perspective view of the small, packaged tunable laser of FIG. 4A with an attached optical fiber 818. A ferrule 817 is enclosed within a sheath 816 which is then coupled to the top surface of the cylindrical housing 812, and sealed with a sealing member 815.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A tunable laser assembly comprising:
   a housing comprising a plurality of walls forming an interior space within the plurality of walls and extending from a first end to a second end along an axis;
   an electrical input interface positioned at the first end of the housing and configured to receive an information-containing electrical signal;
   an optical output interface positioned at the second end of the housing and configured to transmit a laser beam along the axis;
   a semiconductor laser positioned in the interior space of the housing and operable to emit the laser beam along the axis, wherein the semiconductor laser is configured to a select the wavelength of the laser beam emitted thereby in response to the information-containing electrical signal received by the electrical input interface;
   an optical isolator positioned exterior of the housing along the axis to receive the laser beam from the optical output interface to at least prevent light from reflecting back into the interior space of the housing; and
   a piezoelectric transducer positioned exterior of the housing and coupled to the optical isolator, wherein the piezoelectric transducer is configured to provide dithering during frequency tuning of the laser beam.

2. The tunable laser assembly of claim 1, wherein the optical isolator is configured to rotate polarization of the laser beam by 90 degrees to improve transmission.

3. The tunable laser assembly of claim 1, further comprising a collimating lens exterior of the housing to receive the laser beam from the optical isolator to direct the laser beam to an optical interface of an optical fiber.

4. The tunable laser assembly of claim 1, further comprising:
   a photodiode positioned in the interior space of the housing to receive at least a portion of the laser beam for determining the emitted intensity of the laser beam; and
   a beam splitter positioned in the interior space of the housing to receive the laser beam from the semiconductor laser and configured to direct a beam portion substantially orthogonal to the axis to the photodiode.

5. The tunable laser assembly of claim 4, further comprising a wedge-shaped support configured to position the beam splitter.

6. The tunable laser assembly of claim 1, wherein the optical output interface comprises a window positioned at the second end of the housing to permit the laser beam to exit the interior space of the housing to the optical isolator.

7. The tunable laser assembly of claim 1, wherein the semiconductor laser comprises:
   a first tunable optical filter subassembly;
   a second tunable optical filter subassembly; and
   a gain chip positioned between the first tunable optical filter subassembly and the second tunable optical filter subassembly.

8. The tunable laser assembly of claim 7, wherein the gain chip comprises a diode laser extending from a rear facet to a substantially non-reflective front facet.

9. The tunable laser assembly of claim 7, wherein each of the first and second tunable optical filter subassemblies are decoupled from the gain chip.

10. The tunable laser assembly of claim 7, wherein each of the first and second tunable optical filter subassemblies comprises a tunable filter element, where the tunable filter element of each of the first and second tunable optical filter subassemblies comprises one or more of a Bragg grating, a Fabry-Perot etalon, and a liquid crystal waveguide.

11. The tunable laser assembly of claim 7, wherein each of the first and second tunable optical filter subassemblies comprises a tunable filter element, where the tunable filter elements of the first and second tunable optical filter subassemblies define a Vernier tuning mechanism including respective sets of transmission peaks having slightly different free spectral ranges and similar finesses, wherein semiconductor laser is configured to shift a second set of transmission peaks of the tunable filter of the second optical filter subassembly relative to a first set of transmission peaks of the tunable filter of the first optical filter subassembly to align a single transmission peak of each of the first and second sets of transmission peaks.

12. The tunable assembly of claim 1, further comprising a thermoelectric cooler, wherein at least a portion of the semiconductor laser is coupled to thermoelectric cooler, wherein the thermoelectric cooler is configured to control the temperature of the at least a portion of the semiconductor laser.

13. The tunable assembly of claim 12, wherein the semiconductor laser further comprises one or more tunable optical filter subassemblies coupled to and thermally isolated from the thermoelectric cooler.

14. The tunable assembly of claim 13, further comprising one or more benches coupling the one or more tunable filter subassemblies to the thermoelectric cooler to thermally isolate the one or more tunable filter subassemblies from the thermoelectric cooler, wherein the one or more benches comprise glass.

15. The tunable assembly of claim 12, wherein the semiconductor laser further comprises a gain chip, wherein the thermoelectric cooler is coupled to the gain chip to control the temperature of the gain chip.

* * * * *